United States Patent [19]
Watkins et al.

[11] Patent Number: 5,867,395
[45] Date of Patent: Feb. 2, 1999

[54] GATE NETLIST TO REGISTER TRANSFER LEVEL CONVERSION TOOL

[75] Inventors: Daniel Watkins, Saratoga; Gagan Gupta, Milpitas; Satish Venugopal, Santa Clara; Kosala Abeywickrema, San Jose; Venkat Mattela, Sunnyvale; Kumar Bhattaram, Fremont, all of Calif.

[73] Assignee: LSI Logic Corporation, Milpitas, Calif.

[21] Appl. No.: 668,064

[22] Filed: Jun. 19, 1996

[51] Int. Cl.$^6$ .............................. G06F 17/00; G06F 17/50
[52] U.S. Cl. ......................... 364/488; 364/489; 364/490
[58] Field of Search .................................. 364/488–491, 364/578; 395/500

[56] References Cited

U.S. PATENT DOCUMENTS

| | | | |
|---|---|---|---|
| 5,392,227 | 2/1995 | Hiserote | 364/578 |
| 5,426,591 | 6/1995 | Ginetti et al. | 364/489 |
| 5,471,398 | 11/1995 | Stephens | 364/490 |
| 5,537,330 | 7/1996 | Damiano et al. | 364/489 |
| 5,623,418 | 4/1997 | Rostoker et al. | 364/489 |
| 5,638,381 | 6/1997 | Cho et al. | 371/22.4 |

OTHER PUBLICATIONS

Akhilesh Tyagi "VLSI Design Parsing", IEEE, 1992, pp. 30–34.

Chowdhury et al. "Hierarchical Layout Synthesis of Analogue VLSI Circuits Using An Intelligent Parsing Mechanism," IEEE, 1992, pp. 835–838.

Singh et al "Extracting RTL Models from Transistor Netlists", IEEE; 1995, pp. 11–17.

Fischer et al. "NETHDL: Abstraction Of Schematics To High–Level HDL," IEEE, 1990, pp. 90–96.

Primary Examiner—Kevin J. Teska
Assistant Examiner—Vuthe Siek
Attorney, Agent, or Firm—Oppenheimer Woff & Donnelly LLP

[57] ABSTRACT

The present invention discloses a system to reverse-synthesize a gate level netlist definition of an integrated circuit (IC) design to corresponding register transfer level (RTL) definition of the same circuit. The typical process to implement an integrated circuit is to complete the RTL design first, which is then used, to generate gate level netlist definition, and eventually, a layout level design targeted to a particular process technology. The RTL design definitions, being a general description of the circuit, may be ported to different process technologies. However, the gate netlist level design, being a more specific or lower level definition of the circuit, is not easily ported to other integrated circuit design processes. To port a gate netlist level design to another process technology, the gate netlist should be converted, or reverse-synthesized back to a RTL level design. The present invention describes the method and apparatus to reverse-synthesize gate netlist level definitions into RTL definitions by parsing and analyzing the gate netlist level definition, generating an equivalent RTL definition, and verifying correctness of the RTL definition.

9 Claims, 5 Drawing Sheets

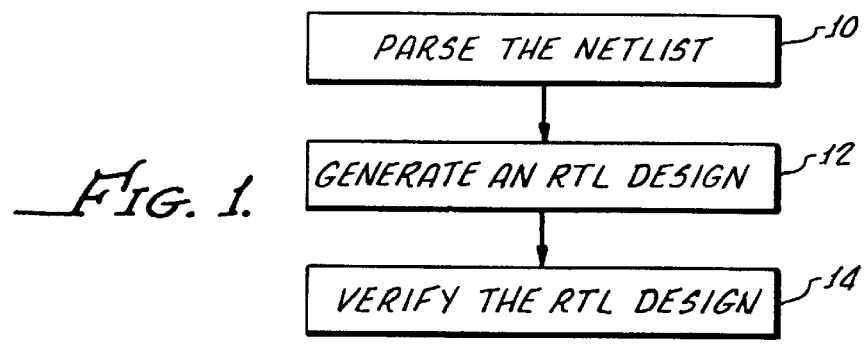
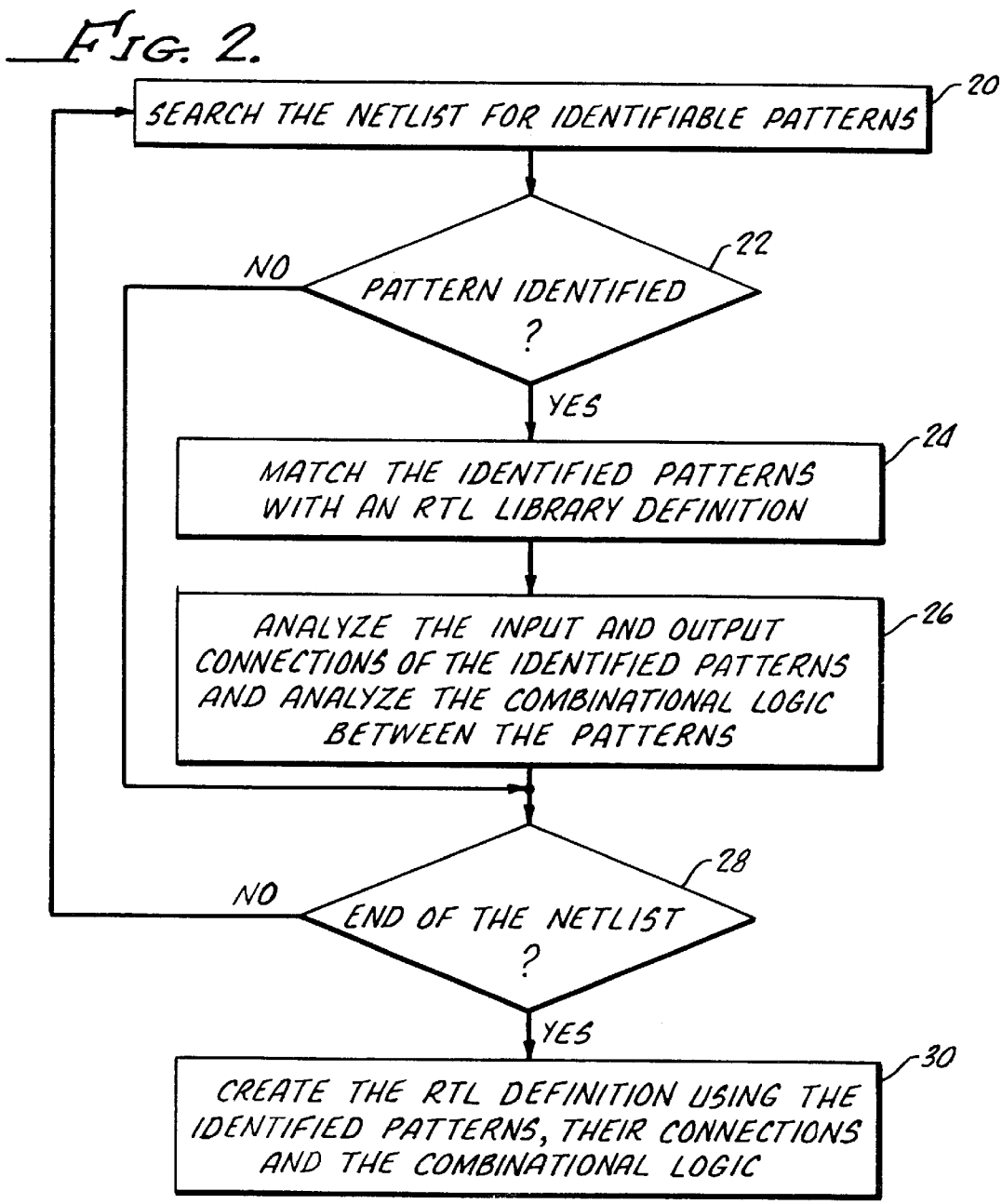

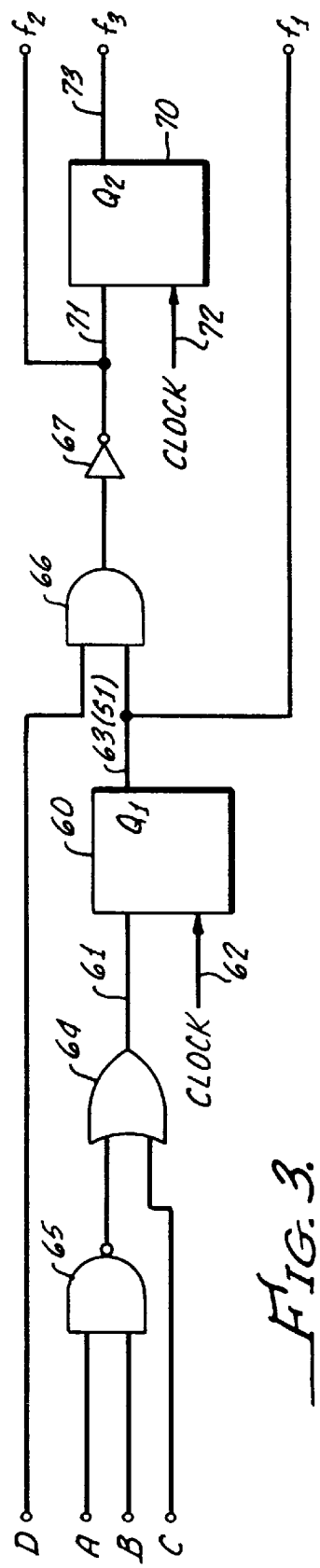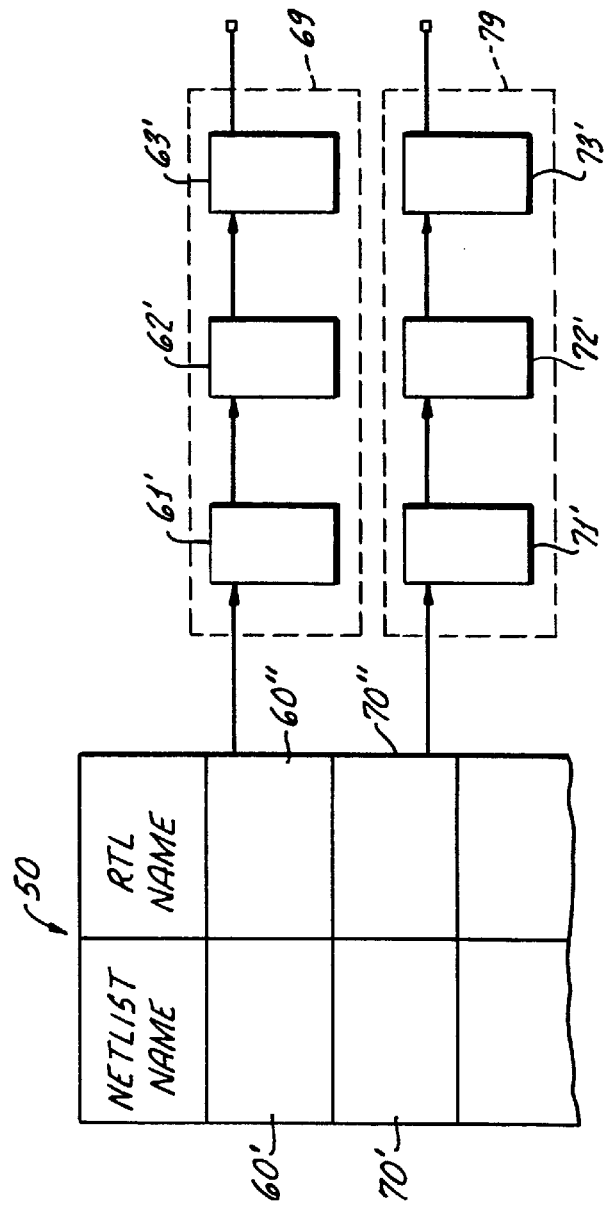

GATE NETLIST TO REGISTER TRANSFER LEVEL CONVERSION TOOL

BACKGROUND OF THE INVENTION

1. Field of the Invention

The present invention relates to the field of integrated circuit (IC) design methodology. More particularly, the present invention relates to the field of the IC design process and the conversion process of producing register transfer level definition of ICs from a gate level definition of the ICs.

2. Description of the Related Art

To design and produce an integrated circuit (IC), a specification document is first drafted, and after many intermediate steps, layout level design, performing the functions as defined by the specification, is produced. The layout level design is the lowest level description of the IC design. In the layout level design, the transistors are represented as geometric figures with physical dimensions such as length, width and position.

The IC design process involves complex subprocesses requiring many intermediate steps. At each of these intermediate steps, the IC design is represented at a different level of specificity.

One of the higher level descriptions of an IC design is the Register Transfer Level (RTL) design. In the RTL, variables and data operators represent the IC components such as registers and functional blocks of the sections of the IC. Being a more generic high-level description of the IC, the RTL design could be easily mapped across different IC design process technologies.

The next lower level description of IC in the design process is the Logic Level design at which the IC is defined as a set of interconnecting logic gates such as AND, OR gates and memory components such as flip-flops. This level is also called the Gate Netlist Level, and the IC design at this level of specificity will be referred to as the "Netlist" in this document. Netlist is a more specific definition of the IC design than a RTL design. A Netlist design is much less portable for use in other IC design process technologies because Netlist is technology and process specific. Also, making modifications and upgrading designs in Netlist form is cumbersome. On the other hand, modifying and upgrading RTL designs is relatively easy. Hence, it is desirable to have designs in the RTL form.

The process of translating an RTL design into a Netlist design is commonly referred to as "synthesis." Because the RTL methodology of expressing designs is a relatively new concept, most earlier IC designs were hand-tuned or hand-crafted at the Netlist level without having a corresponding RTL designs. In fact, many of the current IC designs exist only as Netlist definitions. Since tremendous effort has gone into these designs and many of these designs have to be used in newer process technologies, obtaining a RTL description of these designs would prove to be very useful.

As the IC design process technology developed over the years and the IC designs became increasingly larger and more complex, the industry developed many different process technologies to implement IC designs. Most of these process technologies support synthesis of RTL designs into their corresponding Netlist designs and, eventually, Layout Level designs. However, the IC designs existing only at the Netlist level cannot take advantage of the new process technologies because Netlists are highly process and technology dependent. Once a design is mapped to a one process technology it is very difficult to migrate to another process technology. For example, at the layout level a NAND gate in one process technology would inherit different electrical characteristics such as capacitance, and rise time, etc. But when migrating to another technology the NAND gates available in the new technology would not essentially have the same electrical characteristics as the previous one.

The present invention discloses a method to overcome this problem by converting, or reverse-synthesizing, Netlist designs into corresponding RTL designs defining the same IC. After reverse-synthesizing Gate Netlist definitions into corresponding RTL designs, the IC design which was defined using only the Netlist definition can now be ported to other, new process technologies.

A company called Chrysalys offers a reverse-synthesis tool to convert Netlist designs to behavioral level designs which are similar to RTL designs. However, Chrysalys' reverse-synthesis is performed using a mathematical equivalence method and the resultant behavioral level designs are generally not synthesizable using new IC design process technologies.

The only other remaining option for reverse-synthesizing Netlist designs into RTL designs is to manually study the Netlist to hand-generate the corresponding RTL design. However, this is very time consuming, lacks a refined methodology, and is prone to error.

SUMMARY OF THE INVENTION

The present invention provides a system for generating a RTL definition for an integrated circuit (IC) design by analyzing the Netlist definition of the IC. According to a broad aspect of the present invention, the conversion from a Netlist design to an RTL design is accomplished by parsing and analyzing the Netlist design and generating the corresponding RTL design using the information. Then, the RTL design is verified by running a predetermined set of inputs, or verification suites, on the Netlist and on the RTL designs, and comparing the results.

To parse and analyze the Netlist, identifiable patterns of memory components in the Netlist are located and correlated with matching RTL definitions from a predefined RTL library. Then, the combinational logic between the identified patterns of the Netlist is analyzed. Finally, a corresponding RTL definition is generated using the matched RTL definitions and the combinational logic connections between the identified patterns.

The verification of the RTL design is done by running verification suites against the Netlist design, running the same suite against the RTL design, and comparing the results.

The present invention may be implemented as a computer program executable by specialized or a general purpose computer, or a specially designed apparatus to process Netlist definitions to produce RTL designs.

DESCRIPTION OF THE DRAWINGS

FIG. 1 is a flowchart illustrating the steps taken to reverse-synthesize Netlist designs to corresponding register transfer level (RTL) design and to verify the new design;

FIG. 2 is a flowchart illustrating the Netlist parsing and analysis process in a greater detail;

FIG. 3 is a sample integrated circuit (IC) design which may be represented by a Netlist design;

FIG. 4 is a sample hash table and the associated linked list produced from the Netlist analysis process;

DETAILED DESCRIPTION OF THE PREFERRED EMBODIMENTS

Figure 5A:
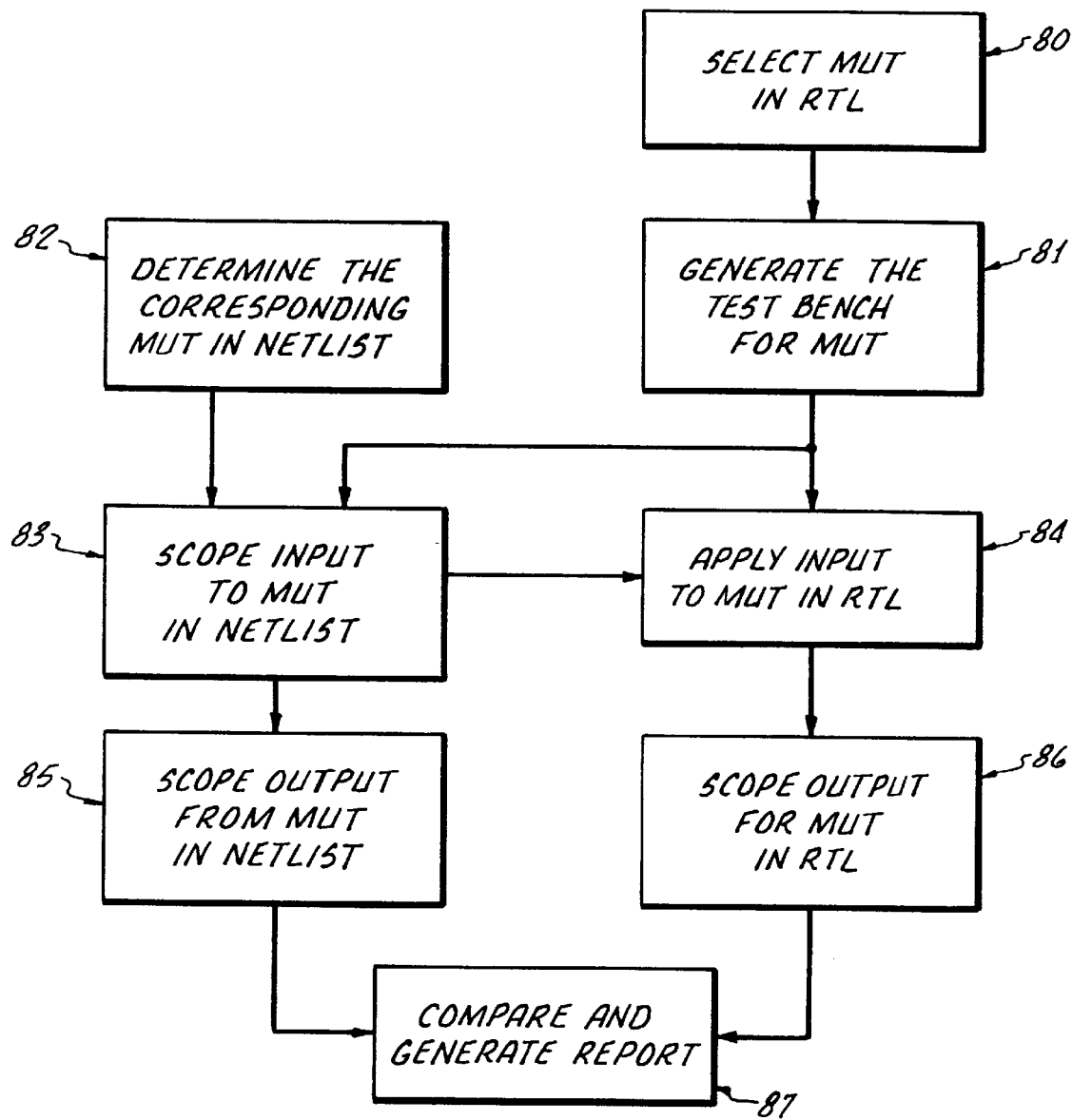
FIG. 5A is a flowchart illustrating the verification process in a greater detail.

Referring to the drawings, particularly to FIG. 1, a process to reverse-synthesize a gate Netlist level design (the "Netlist") defining an integrated circuit (IC) into a register transfer level design (the "RTL design") defining the same IC, and to verify the fact that the generated RTL design performs the same functions as the gate netlist design, is illustrated.

First, the Netlist is parsed and analyzed, as represented by block 10. The parse and analysis step may involve identifying or comparing various parts of the Netlist to predefined RTL constructs. The information obtained during the parsing and analyzing of the Netlist may be saved as a table, a list, or another data structure.

Utilizing the information gained from parsing and analyzing the Netlist, a corresponding RTL design is generated for the IC defined by the Netlist, as represented by block 12. After generating the RTL design, the RTL design is verified to confirm that the IC design as represented by the RTL design behaves like the IC design represented by the Netlist, as represented by block 14.

Referring now to FIG. 2, a flowchart illustrating the Netlist parse and analysis process is presented in a greater detail. First, the Netlist is searched 20 for predetermined identifiable memory component patterns. The identifiable patterns may be predetermined and coded into a search program or may be defined by another input file or a library listing all the Netlist patterns to be identified. Typically, Netlist definitions describing flip-flops are identified because flip-flops are generally used for registers of an IC.

When a pattern is identified 22, the identified pattern is correlated to an RTL construct of an RTL library 24. Then, each input and output connections of the identified pattern is traced to its termination point which is a primary input, a primary output, or an input or an output of another identified pattern 26. While tracing the inputs and the outputs of the identified pattern, the information relating to the combination logic gates in between the identified pattern and the termination points of the input and the output connections is saved. This process continues until the end of the Netlist is reached 28.

After the entire Netlist has thus been searched and analyzed, an RTL design, describing the same IC as the Netlist, is generated. The RTL design is generated by utilizing the RTL constructs, which the identified patterns in the Netlist correlate to, and by expressing, in the language used to define the RTL design, the combinational logic connections. Typically a high level definition language (HDL) such as Verilog is used to define an RTL design.

A sample integrated circuit (IC) design which may be represented by a Netlist design is illustrated by FIG. 3. FIG. 4 illustrates a hash table and associated linked-lists, which, collectively represent the information gathered from parsing and analyzing of the Netlist. Alternative embodiments of the present invention may use other data structures to represent the information gathered from parsing and analyzing the Netlist. In the preferred embodiment as disclosed by FIG. 4, a hash table is used to maintain the list of identified patterns for efficient access.

Referring to FIGS. 3 and 4, one implementation of the parse and the analysis process of a Netlist of the present invention may be discussed in detail. In the example illustrated by the figures, elements 60 and 70 may be the identifiable memory component patterns of the Netlist. In one embodiment of the present invention, the reverse-synthesis process identifies flip-flops of the Netlist and correlates them to matching RTL constructs of an RTL library. Here, the flip-flops 60 and 70 are identified and a hash table 50 is updated to include the Netlist name for the flip-flops 60' and 70' and their correlated RTL construct names 60" and 70". The hash table is caused to point to linked-lists which contain information regarding the input and output connections of each of the identified patterns.

Each input and output connections for each of the identified patterns 60 and 70 is traced to its termination point, which may be a primary input, a primary output, or another identified pattern. In addition, for each of the inputs and outputs traced, an element is created in the linked-list, associated with the corresponding flip-flop in the hash table, describing the links of the connections to a termination point, including any combinational logic which may couple the connection to a termination point. In the example, for the flip-flop 60, the input connections 61 and 62 are traced and the output connection 63 is traced. For the connections 61, 62, and 63, elements 61', 62', and 63' in the linked-list 69, pointed to by the hash table entry for the pattern 60, are created. As FIG. 3 illustrates, the connection 61 is traced to the primary inputs A, B, and C, and the element 61' contains the primary inputs as well as the combinational logic between the primary inputs and the connection 61, namely an NAND gate 65 and an OR gate 64. The connection 62 is traced to the system clock and this is noted by the element 62'. The output connection 63 is traced to the primary output f1 and to the primary output f2 and the second flip-flop 70 via an AND gate 66 and an INVERTER 67. The element 63' contains the information relating to the output connection 63.

Likewise, the connections 71, 72, and 73 for the flip-flop 70 are traced to their termination points and the linked-list elements 71', 72', and 73' are caused to contain the connection information and combinational logic information for the connections 71, 72, and 73, respectively.

Following the parse and the analysis of the Netlist, the resulting hash table 50 and the associated linked-lists 69 and 79 are used to create an RTL design of the IC. More specifically, an RTL design is generated using the RTL names for the Netlist modules which were identified as having an equivalent RTL constructs, and expressing the connections and the combinational logic of the connections, as defined by the linked-lists, using RTL expressions. Utilizing the example circuit of FIG. 3, a sample RTL design generated may appear as follows:

Always at (posedge clock)
    Begin
        s1 < = #T.P. ( not(A and B) or C);
    End
Always at (posedge clock)
    Begin

```
        f3 < = #T.P. (not (s1 and D));
    End
Assign f1 = s1
Assign f2 = not (s1 and D)
```

Thus the RTL design is created from the information gathered from the analysis of the Netlist design.

If the netlist exists in a form such that it is hierarchically divided into modules, the corresponding RTL will represent the same hierarchy. However, if the netlist is not divided into modules and is a flat representation of the design, the corresponding RTL will also be a flat representation of the design.

Once the RTL has been generated, it is necessary to verify the validity of the RTL representation against the original Netlist design. All existing designs are verified for correctness of functionality and it is safe to assume that a verification suite already exists for the Netlist design. The verification methodology described in this patent uses the same verification suite to verify the correctness of the RTL representation.

Verification can be done at either the top level of the design, or hierarchically at the module level. The methodology described below is applicable to either approach. It is assumed that the verification suite exists for the top level design and is in a form that specifies the input stimuli and the corresponding output response. This is the minimum form in which a verification suite can exist. If verification is available at module level, for a hierarchical design, the same methodology applies.

Figure 5B:
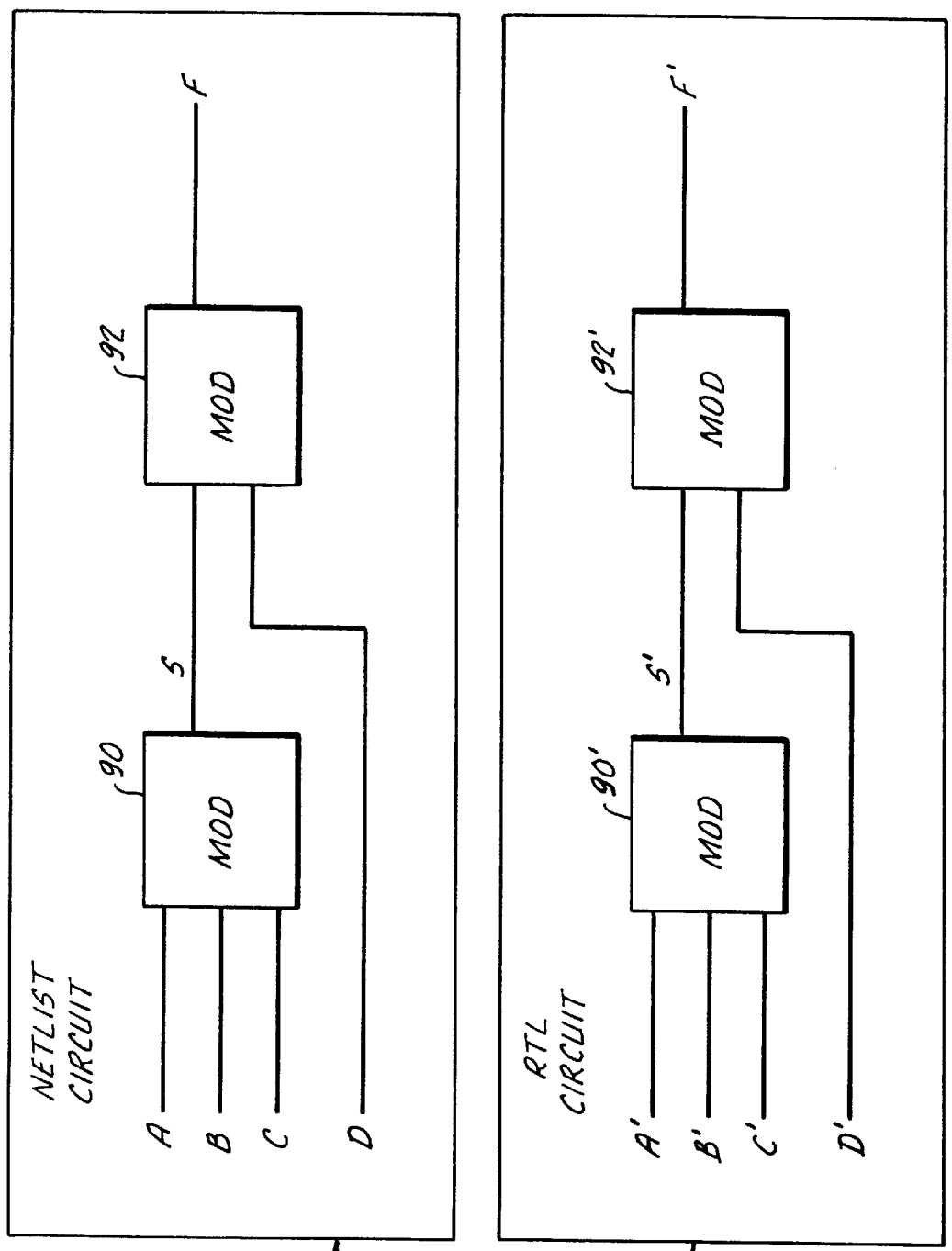
FIG. 5B is an example of a Integrated Circuit design as defined by a Netlist definition and as defined by an RTL definition.

Referring to FIG. 5A, a flowchart illustrating the verification process is presented in a greater detail. In describing the verification process, a sample IC designs as illustrated by FIG. 5B is used. FIG. 5B shows the sample IC design as defined by a Netlist and as defined by an RTL definition. The following discussion will refer to FIGS. 5A and 5B.

Each of the submodules of the IC as defined by the RTL is tested following the steps discussed below.

First, an RTL module is selected to be tested as indicated by the reference number 80. This module is called a Module Under Test (MUT). For example, FIG. 5B illustrates a sample IC design as defined by the Netlist (the "Netlist circuit") 91 and the same IC design as defined by the new RTL definition (the "RTL circuit") 91'. Each of the modules of the RTL circuit 91', mod 90' and Mod 92' will be selected, in turn, to be verified. Finally, the top level RTL circuit 91' will be verified. In the following discussions, we will assume that RTL module Mod 92' is selected as the MUT.

Second, a test bench is automatically generated for the selected module as indicated by reference number 81. A test bench is a setup which enables one to apply input stimuli to the module under test (MUT) and monitor the outputs of the MUT. A test bench can be completely defined by the MUT, the input signals and the output signals. For example, (S', D') are inputs of the Module 92' and (F') is the output of the Module 92', where, S' is the output signal of the Module 90' and D' is one of the primary inputs to the IC design illustrated by FIG. 5B. A test bench can apply prespecified stimuli (called input vector) to the inputs (S', D') and monitor the output F' to capture the response of the MUT to the input stimuli. We will call the input vectors and the corresponding output responses, signal vectors for the test bench.

After the test bench for the selected module is generated, the signal vectors for the test bench are extracted by (1) identifying the corresponding module in the Netlist circuit 91, as indicated by the reference number 82, and (2) applying a predetermined set of inputs from the existing verification suite to the primary inputs of the Netlist circuit 91, and (3) scoping, or reading the input signals of the identified module to form the input vectors for the selected module. (4) The output signals of the identified module are also scoped or read, to capture the expected response, as indicated by reference number 85.

The identification of the selected module from RTL, in the Netlist description, is also an automated process, and can be easily accomplished with the aide of the input and output signals of the module. The signal vectors for testing of a module can be extracted as described above, for the entire verification suite or a part of it, as deemed necessary. These extracted signal vectors are then used for the verification of the MUT.

For example, the IC Netlist design of FIG. 5B includes four primary input lines (A, B, C, and D), one intermediate signal line (S), and one output lines (F). After identifying the module Mod 92 as the corresponding Netlist module to the RTL Mod 92' to be verified, a predetermined set of signal vectors from the verification suite are applied to the primary input lines A, B, C, and D. The predetermined set of signal vectors may comprise $\{0, 0, 0, 0\}, \{0, 0, 0, 1\}, \{0, 0, 1, 0\}, \ldots \{1, 1, 1, 1\}$.

While the predetermined set is being applied to the primary input lines, the values for the input lines (input vectors) for Mod 92, D and S, are scoped, and the value for the output line F is scoped as indicated by the reference numbers 83 and 85. In this example, the lines D and S, inputs for the MUT, are scoped as well as the line F.

Third, the input vectors scoped from the lines D and S of the Netlist circuit 91 are applied to the lines D' and S', the input lines for the RTL Mod 92' through the test bench, and the output F' is scoped, as indicated by the reference number 84.

Finally, the scoped output F of the Netlist circuit 91 is compared with the scoped output F' of the RTL circuit 91', and a verification report is generated. If the outputs match, then the RTL Module Under Test (MUT) is assumed to be coded correctly in the RTL and can be synthesized by setting the appropriate load and timing requirements for the input and the output signals. However, if there are mismatches between the outputs of the RTL MUT signals and the Netlist MUT signals, then the tool generates a report containing the signal names that are mismatching, their values, and the timing of the mismatches. The report is used to troubleshoot the generated RTL definition or the RTL generation parameters and the process.

Not only is the above methodology applicable to submodules, it is also applicable to the top level design by simply considering the top level design as a module.

Figure 6:
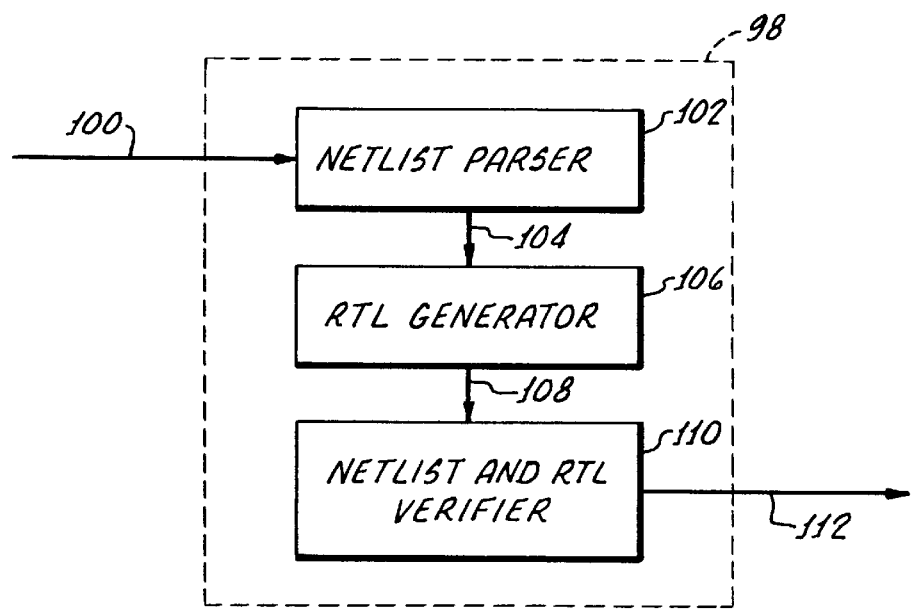
FIG. 6 is a block diagram of an exemplary embodiment of a system for performing the Netlist to RTL conversion process.

Referring now to FIG. 6, an exemplary embodiment of a hardware system implemented in accordance with the methodology and the principles of the present invention is shown. Data 100, representing a Netlist is input into a Netlist Parser 102 as well as to a Netlist and RTL Verifier 110. The Parser 102 parses and analyzes the Netlist to generate hash tables and linked-lists and forwards 104 them to the RTL Generator 106. The RTL Generator 106 generates the corresponding RTL design from the hash tables and the linked-lists, and passes the RTL design 108 to the Netlist and RTL Verifier 110.

The Netlist data 100 and the RTL design 108 is received by the Verifier 110 which runs a predetermined sets of test suites against various components of the Netlist and the RTL design, compares the test results, and produces a test comparison report 112.

Figure 7:
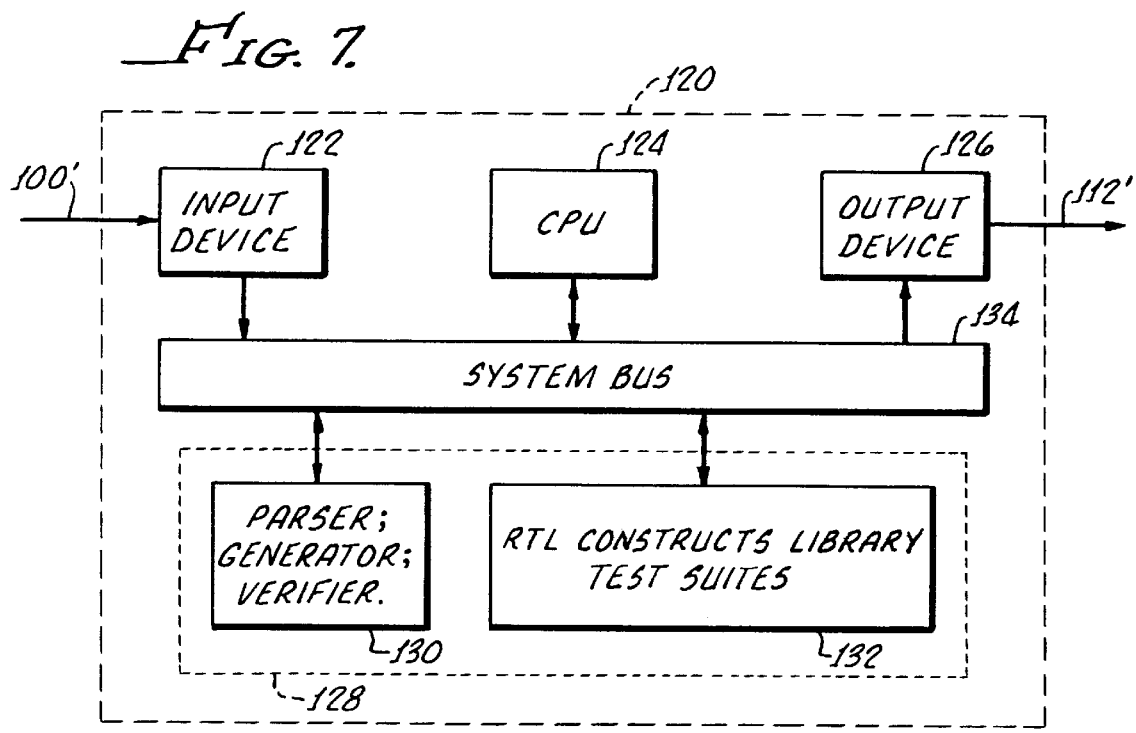
FIG. 7 is a block diagram of an exemplary embodiment of a computer system implemented in accordance with the principles of the present invention.

Referring to FIG. 7, an exemplary embodiment of a computer system implemented in accordance with the principles of the present invention is shown. The computer system includes a communication system bus 134 to which a central processing unit (CPU) 124 and a memory 128 are coupled. An input device 122 and an output device 126 are also coupled to the system bus 134.

The input device 122 may be any type of input device such as a keyboard, a monitor, a port, a memory system such as a ROM, RAM, or a computer readable disk and driver, or another computing unit attached to the system to provide the computing system 120 with the Netlist data 100' to be reverse-synthesized. The output device 126 may be any type of output device such as a port, a monitor, a printer, or other electronic memory systems.

The memory 128 may comprise RAM, ROM, magnetic, optical, or other electronic or mechanical memory device which can store the instructions and data for the CPU 124 to perform the Netlist to RTL design reverse-synthesis functions in accordance with the present invention. In particular, the memory 128 may comprise a set of instructions 130 to perform the functions of the Parser, the Generator, and the Verifier as discussed above. In addition, the memory 128 comprise other data 132 to aid in the performance of the steps of the present invention such as a Library of RTL Constructs and one or more Test Suites to be used to verify RTL designs.

The system 120 operates when the CPU 124 executes the programming steps as defined by the Parser, the Generator, and the Verifier 130 and reads the Netlist data 100' using the input device 122 and performs the functions the steps discussed above to analyze the Netlist, generate an RTL design, and verifies the RTL design. Finally, the CPU 124 causes the output device 126 to produce the resultant RTL design and the verification report 112'.

Thus disclosed are methods and apparatus for reverse-synthesizing a gate level definition of an integrated circuit design into a register transfer level definition of the integrated circuit.

Although the present invention has been described in detail with regard to the exemplary embodiments and drawings thereof, it should be apparent to those skilled in the art that various adaptations and modifications of the present invention may be accomplished without departing from the spirit and the scope of the invention. Therefore, the present invention is not limited to the precise embodiments described hereinabove.

What is claimed is:

1. A method of reverse-synthesizing gate netlist definition to register transfer level (RTL) definition, said method comprising the steps of:
   (a) using a computer to parse the gate netlist, said parsing step comprising the substeps of:
      determining primary inputs and primary outputs of said netlist;
      searching the gate netlist for flip-flops;
      identifying input/output (I/O) lines of said flip-flops; and
      tracing said I/O lines to said primary input, said primary output, and said flip-flops;
   (b) running a predefined set of input signals against said gate netlist and extracting netlist test results;
   (c) running said set of input signals against said RTL design and extracting RTL test results; and
   (d) comparing said netlist test results with said RTL test results.

2. A method of reverse-synthesizing integrated circuit gate netlist definition on a computer storage medium to register transfer level (RTL) definition, said method comprising:

reading the gate netlist definition from the computer storage medium;

identifying predetermined flip-flops and patterns of logic gates in the gate netlist;

correlating said identified patterns with matching RTL definitions from a predefined RTL library, wherein said correlation between said identified patterns and said matching RTL definitions are kept in memory;

mapping input and output (I/O) connections between said identified patterns;

determining combinational logic between said identified patterns; and generating RTL definitions based on said matching RTL definitions, said I/O connections, and said combinational logic.

3. The method as defined in claim 2 wherein said correlation between said identified patterns and said matching RTL definitions are kept as a hash table.

4. The method as defined in claim 2 wherein said the I/O connections of connections are kept as a linked list.

5. The method as defined in claim 2 wherein said combinational logic information are kept as a linked list.

6. An apparatus for reverse-synthesizing gate netlist definition to register transfer level (RTL) definition, said apparatus comprising:

a parser for identifying primary inputs and primary ouputs of said netlist, for searching for and identifying predetermined patterns of flip-flops in the gate netlist, and for tracing input/output (I/O) lines of said flip-flops to said primary input, said primary output, and said flip-flops;

a reverse-synthesizer coupled to said parser for translating said identified patterns into RTL definition for;
   identifying flip-flops in said gate netlist;
   selecting corresponding RTL constructs for said identified flip-flops from a library of RTL constructs;
   determining combinational logic between said flip-flops and said primary inputs and said primary outputs; and
   expressing said combinational logic using RTL constructs; and a verifier for running test suites on the gate netlist and on the RTL definition, obtaining results from said tests, and comparing said results from said tests.

7. A computing system for reverse-synthesizing gate netlist definitions to register transfer level (RTL) definition, said system comprising:

a processor;

memory in communication with said processor for storing instructions for said processor, said instructions capable of causing the computer system to implement the average-synthesizing apparatus of claim 6:

an input device for receiving the gate netlist definition;

an output device for sending the RTL definition; and an electronic bus for connecting said processor with said memory, said input device, and said output device.

8. The system for claim 7 wherein said memory stores a RTL constructs library.

9. A computer storage medium that stores a plurality of executable instructions for instructing a computer to reverse-synthesize gate netlist definitions to register transfer level (RTL) definitions according to the method of claim 1.

* * * * *